US006867490B2

(12) United States Patent
Toyosawa

(10) Patent No.: US 6,867,490 B2
(45) Date of Patent: Mar. 15, 2005

(54) SEMICONDUCTOR DEVICE

(75) Inventor: Kenji Toyosawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/727,489

(22) Filed: Dec. 5, 2003

(65) Prior Publication Data

US 2004/0108594 A1 Jun. 10, 2004

(30) Foreign Application Priority Data

Dec. 9, 2002 (JP) .......................................... 2002-357089

(51) Int. Cl.⁷ ............................................... H01L 23/48
(52) U.S. Cl. ........................ 257/692; 257/696; 257/734
(58) Field of Search ................................ 257/690, 692, 257/696, 734–737

(56) References Cited

U.S. PATENT DOCUMENTS 5,349,238 A * 9/1994 Ohsawa et al. ............. 257/736
5,442,229 A * 8/1995 Mori et al. ................. 257/666
5,825,081 A * 10/1998 Hosomi et al. ............. 257/668
6,603,071 B2 * 8/2003 Takao ......................... 174/52.1
6,744,120 B1 * 6/2004 Yanagisawa ................ 257/668

FOREIGN PATENT DOCUMENTS

JP          07-335692       12/1995
JP          2000-269611      9/2000

* cited by examiner

Primary Examiner—T. N. Quach
(74) Attorney, Agent, or Firm—Harness, Dickey & Pierce, P.L.C.

(57) ABSTRACT

A semiconductor device of the present invention has two inner inner leads to be bonded with inner-side bump electrodes each placed at a position which is a relatively large distance apart from the edge of a semiconductor chip, between outer-side bump electrodes each placed at a position which is a relatively small distance apart from the edge of the semiconductor chip. At least one of the inner inner leads is bent in accordance with a bonding position with the inner-side bump electrode.

15 Claims, 11 Drawing Sheets

SEMICONDUCTOR DEVICE

This Nonprovisional application claims priority under 35 U.S.C. § 119(a) on Patent Application No. 2002/357089 filed in Japan on Dec. 9, 2002, the entire contents of which are hereby incorporated by reference.

FIELD OF THE INVENTION

The present invention relates to a semiconductor device, and more specifically, to a semiconductor device having inner leads provided at a fine pitch.

BACKGROUND OF THE INVENTION

A COF (Chip On Film) in which a semiconductor chip made up of LSI and other components is mounted on a film substrate is used as a package for liquid crystal driver. In case of the COF, bump electrodes are provided at a predetermined alignment pitch in a periphery of the semiconductor chip. These bump electrodes are bonded with the inner leads to connect between the semiconductor chip and the film substrate. That is, as shown in FIG. 9(a), bump electrodes 18 are provided on a semiconductor chip 16, and the bump electrodes 18 are connected respectively to inner leads 10 supported by a film substrate (not shown). The inner lead 10, as shown in FIG. 9(b), is placed linearly from the edge, which is the end of the semiconductor chip 16, to the bump electrode 18 and is bonded with the bump electrode 18.

In recent years, with the development of microfabrication, multi-outputs has been advanced by increase in the number of bump electrodes for the purpose of connecting input and output terminals of the semiconductor chip 16 to external wires. Moreover, size reduction of the semiconductor chip 16 has been advanced in terms of size reduction of a semiconductor device and other reasons. For the realization of the multi-outputs and size reduction of the semiconductor chip 16, improvement in fine pitch of the bump electrodes 18 on the semiconductor chip 16 must be advanced.

Specifically, as shown in FIG. 10(a), bump electrodes 19 aligned in a periphery of the semiconductor chip 16 are arranged at high density, allowing for improvement in fine pitch of the bump electrodes. Thus, a high-density arrangement of the bump electrodes 19, as shown in FIG. 10(b), needs a smaller distance between the bump electrodes 19 or reduction in width of the bump electrode 19.

However, reduction in distance between the bump electrodes 19 or reduction in width of the bump electrode 19 causes a problem of lowering a bonding accuracy in bonding between the bump electrode 19 and an inner lead 11. That is, the bump electrode 19 on the semiconductor chip 16 is bonded with the inner lead 11 on a film substrate by thermocompression bonding. This bonding causes the thermal expansion of the film substrate made up of organic material at a part subjected to thermocompression bonding, resulting in approximately 10 $\mu$m to 20 $\mu$m stretch of the film substrate. This stretch of the film substrate causes variations in the positions of the inner leads 11 on the film substrate. Therefore, the inner lead 11 provided on the film substrate so as to correspond to the position where the bump electrode 19 is provided on the semiconductor chip 16 may be shifted from the position where the bump electrode 19 is provided.

When the semiconductor chip 16 is a rectangle, shifted positions between the inner lead 11 and the bump electrode 19 on the semiconductor chip 16 caused by the thermal expansion in thermocompression bonding occurs especially at the bump electrodes 19 provided along the end part on a long side of the semiconductor chip 16, not at the bump electrodes 19 in a central part of the semiconductor chip 16. This is because the thermal expansion of the film substrate cumulatively increases with increasing distance to the end part of the semiconductor chip 16.

The above shifted position of the inner lead 11 causes lowering in bonding accuracy in bonding between the bump electrode 19 and the inner lead 11. That is, in thermocompression bonding, due to the shifted position of the inner lead 11, the inner lead 11 comes into contact with a bump electrode which is not an intended bump electrode 19 to be bonded with, resulting in shorts and lead defects.

For these reasons, there is a limit of reduction in distance between the bump electrodes 19 or reduction in width of the bump electrode 19, and therefore, there is a limit of improvement in fine pitch of the inner leads 11. Specifically, in the currently mass-produced COF shown in FIG. 10(a), as shown in FIG. 10(b), a width $w_{10}$ of the bump electrode 19 is 25 $\mu$m, and a distance $d_{10}$ between the bump electrodes 19 is 15 $\mu$m. From this, an alignment pitch $m_{10}$ of the bump electrode 19 becomes 40 $\mu$m. That is, at the current bonding accuracy, a pitch $p_{10}$ of the inner leads in the COF is as large as approximately 40 $\mu$m. Thus, in the COF shown in FIG. 10(a), reduction in distance between the bump electrodes 19 or reduction in width of the bump electrode 19 might cause shorts and leak defects, which results in the difficulty of further improvement in fine pitch.

As a technique for improving fine pitch, as shown in FIG. 11(a), suggested is a technique of arranging bump electrodes 17a and 17b in a staggered manner in a periphery of the semiconductor chip 16 (For example, Japanese Laid-Open Patent Application No. 335692/1995 (Tokukaihei 7-335692; published on Dec. 22, 1995), Japanese Laid-Open Patent Application No. 269611/2000 (Tokukai 2000-269611; published on Sep. 29, 2000), etc.). In this case, when the bump electrodes 17a and 17b are arranged in a staggered manner, a bump electrode 17a located on the outer side (hereinafter referred to as outer-side bump electrode) is bonded with an inner lead 12a arranged linearly extending from the edge of the semiconductor chip 16, as described with reference to FIG. 9(a) and FIG. 9(b). Further, to a bump electrode 17b located on the inner side (hereinafter referred to as inner-side bump electrode), arranged is one inner lead 12b through the passage between the outer-side bump electrodes 17a, extending from the edge of the semiconductor chip 16.

In such an arrangement, as shown in FIG. 11(b), the outer-side bump electrodes 17a are spaced at a predetermined distance so that the inner lead 12b bonded with the inner-side bump electrode 17b does not come into contact with the outer-side bump electrode 17a. Moreover, the inner-side bump electrode 17b is so arranged as to be linearly bonded with the inner lead 12b passing through the passage between the outer-side bump electrodes 17a.

Thus, the outer-side bump electrodes 17a are spaced at a predetermined distance to arrange the inner lead 12b, so that an alignment pitch of the outer-side bump electrodes 17a is smaller than the alignment pitch of the bump electrodes 19 of the COF shown in FIG. 10(a). On the other hand, in the COF shown in FIG. 11(a), the bump electrodes 17a and 17b are arranged in a staggered manner, so that the bump electrodes 17a and 17b can be arranged at high density on the semiconductor chip 16 as in the case of the COF shown in FIG. 10(a).

However, there is a problem that a pitch of the inner leads in the conventional COF of bump electrodes arranged in a staggered manner is as large as approximately 35 $\mu$m.

That is, as shown in FIG. 11(b), when the inner leads 12a and 12b each having a width $v_{11}$ of 15 μm are bonded respectively with the bump electrodes 17a and 17b each having a width $w_{11}$ of 25 μm so as to pass the center of the bump electrodes 17a and 17b, and a distance $f_{11}$ between the outer-side bump electrode 17a and the inner lead 12b arranged between the outer-side bump electrodes 17a is 15 μm, a pitch $p_{11}$ of the inner leads becomes 35 μm.

For further improvement in fine pitch, a width of the bump electrode 17a should be reduced. However, reduction in width of the bump electrode 17a lowers an accuracy of thermocompression bonding between the semiconductor chip 16 and the inner leads 12a and 12b, which tends to occur shifted positions of the inner leads 12a and 12b. As described above, the shifted position of the inner lead 12b causes shorts and leak defects. Moreover, reduction in width of the bump electrodes 17a and 17b in the COF shown in FIG. 11(b) requires enhancement of bonding accuracy of the inner leads 12a and 12b. Therefore, at the current bonding accuracy, further improvement in fine pitch of the inner leads is difficult to realize.

Thus, the conventional COF has a problem that there is a limit of improvement in fine pitch and 35 μm or less inner lead pitch is difficult to attain. Impossibility of realization of improvement in fine pitch of the inner leads results in impossibility of size reduction of the semiconductor chip. Further, this reduces yields of a semiconductor chip inside a wafer, resulting in the difficulty in reduction of costs.

SUMMARY OF THE INVENTION

An object of the present invention is to provide a semiconductor device which can realize improvement in fine pitch of inner leads at a current bonding accuracy without improving a bonding accuracy of inner leads.

A semiconductor device of the present invention is such that in a semiconductor device including a semiconductor chip, including: edge-side bump electrodes each placed on the semiconductor chip at a position which is a relatively small distance apart from an edge of the semiconductor chip; and inside bump electrodes each placed on the semiconductor chip at a position which is a relatively large distance apart from the edge of the semiconductor chip, the edge-side bump electrodes and the inside bump electrodes being bonded with lead wires provided on a film substrate, between the edge-side bump electrodes adjacent to each other provided are at least two lead wires for inside bump electrode use which are bonded with the inside bump electrodes, and at least one of the lead wires for inside bump electrode use is bent in accordance with a bonding position with the inside bump electrode.

According to the above arrangement, two or more lead wires for inside bump electrode use are provided between the edge-side bump electrodes, and at least one of the lead wires for inside bump electrode use is bent. That is, the lead wire for inside bump electrode use is bent in accordance with the position where the inside bump electrode is placed so that it is possible to bond with the inside bump electrode.

Therefore, when the two or more lead wires for inside bump electrode use are provided at a fine pitch to the extent that they do not come into contact with each other, the lead wires for inside bump electrode use can be bonded with the inside bump electrodes in a preferable manner. That is, with the arrangement in which the lead wire for inside bump electrode use is bent in accordance with the position where the inside bump electrode is placed, it is possible to bond between the inside bump electrode and the lead wire for inside bump electrode use in accordance with a pitch of the inside bump electrodes, regardless of a pitch of the lead wires for inside bump electrode use between the edge-side bump electrodes.

Consequently, by providing the lead wires for inside bump electrode use at a fine pitch between the edge-side bump electrodes, the number of lead wires for inside bump electrode use bonded with the inside bump electrode can be increased. As a result, this allows for improvement in fine pitch of the lead wires.

Further, the semiconductor device of the present invention is such that in the above semiconductor device, it is preferable that the lead wires for inside bump electrode use are provided so as to be at a smaller pitch between the edge-side bump electrodes than at the bonding positions with the inside bump electrodes.

According to the above arrangement, a pitch of the lead wires for inside bump electrode use between the edge-side bump electrodes is smaller than a pitch of the lead wires for inside bump electrode use bonded with the inside bump electrodes. That is, between the edge-side bump electrodes, the lead wires for inside bump electrode use are arranged so as to be integrated. Therefore, since more lead wires for inside bump electrode use can be arranged between the edge-side bump electrodes, the lead wires for inside bump electrode use can be bonded with the inside bump electrodes placed at high density. This allows for high-density inside bump electrodes and improvement in fine pitch of the leads wires.

Still further, the semiconductor device of the present invention may be such that in the above semiconductor device, the edge-side bump electrode and the inside bump electrode are provided in a periphery along at least one of four edges of the semiconductor chip, and the inside bump electrode is larger in number than the edge-side bump electrode.

According to the above arrangement, by providing the edge-side bump electrodes to be smaller in number than the inside bump electrodes in a periphery along one edge of the semiconductor chip, it is possible to secure a region for arranging the lead wires for inside bump electrode use between the edge-side bump electrodes. This facilitates the bonding between the inside bump electrodes and the lead wires for inside bump electrode use. Consequently, it is possible to prevent the lead wires for inside bump electrode from coming into contact with the edge-side bump electrodes, thus reducing shorts and leak defects in the lead wires.

Yet further, the semiconductor device of the present invention may be such that in the above semiconductor device, the inside bump electrode further includes first inside bump electrodes each placed at a position which is a relatively small distance apart from the edge of the semiconductor chip and second inside bump electrodes each placed at a position which is a relatively large distance apart from the edge of the semiconductor chip, and lead wires for inside bump electrode use which are bonded with the second inside bump electrodes are provided between at least some of the first inside bump electrodes which are adjacent to each other.

According to the above arrangement, when the first inside bump electrode and the second inside bump electrode are placed respectively at the positions which are different in distance from the edge of the semiconductor chip, it is possible to improve a fine pitch of the lead wires by providing the at least one lead wire for inside bump electrode use between the first inside bump electrodes.

For a fuller understanding of the nature and advantages of the invention, reference should be made to the ensuing detailed description taken in conjunction with the accompanying drawings.

DESCRIPTION OF THE EMBODIMENTS

Embodiment 1

Figure 1:
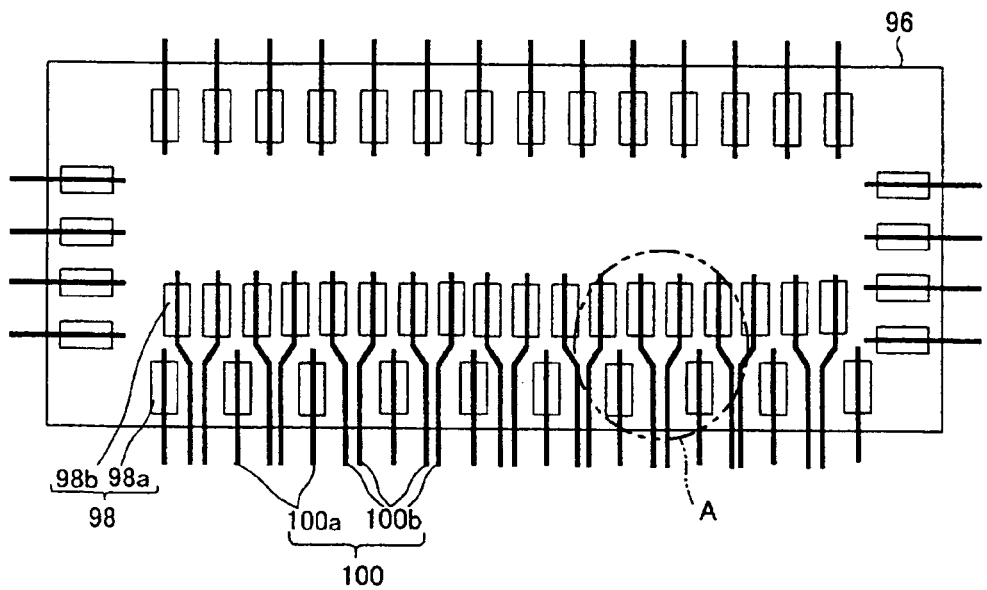
FIG. 1(a) is a plane view showing one embodiment of a semiconductor chip in a COF of the present invention.
FIG. 1(b) is a plane view showing a primary part A in FIG. 1(a).
Figure 1:
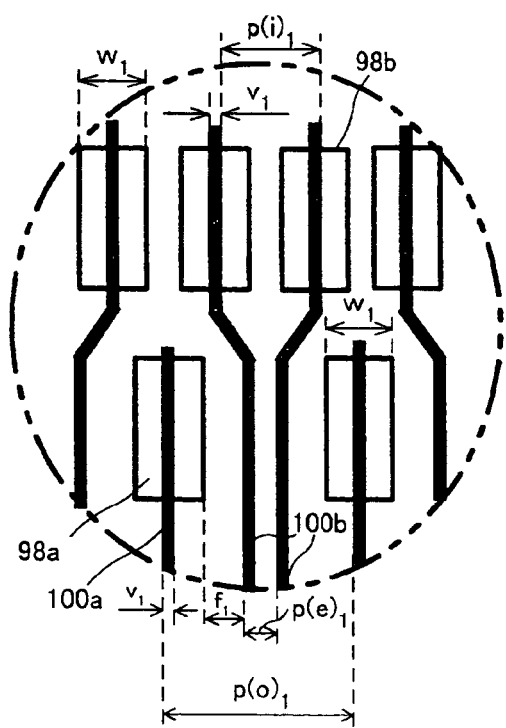

The following will describe one embodiment of the present invention with reference to FIG. 1 through FIG. 4.

As shown in FIG. 2(b), a COF (Chip On Film; semiconductor device) of the present embodiment includes an inner lead (lead wire) 100 supported by a film substrate 101 and a bump electrode 98 provided to a semiconductor chip 96 which are placed so as to be opposed each other and to be electrically connected to each other.

On the inner lead 100 provided on the film substrate 101, formed is a solder resist 94 as protective film made of polyimide or polyurethane material having high heat resistance. The solder resist 94 is provided to prevent damage to the inner lead 100 such as corrosion and leak failure, caused by the adhesion of conductive or ionic foreign substance. The solder resist 94 also prevents the inner lead 100 from be broken by external force and protects the inner lead 100 in the process of bending. Note that, the solder resist 94 is formed to a thickness of 3 $\mu$m to 30 $\mu$m. Further, in order to bond between the bump electrode 98 and the inner lead 100, a resin 99 is formed by flowing and curing epoxy underfill material, for example.

In the COF, as shown in FIG. 2(a), input and output terminals of the semiconductor chip 96 are connected via the inner leads 100 (FIG. 2(b)) to input-side outer leads 91 and output-side outer leads 95, both of which are external wiring. Generally, the input-side outer leads 91 are formed with relatively coarse pitches, and the output-side outer leads 95 are formed with fine pitches, with increase in the number of outputs in recent years. Currently, a COF having 480 outputs is mass-produced.

The film substrate 101, insulating organic material such as polyimide, is thick enough to be bent freely. The inner lead 100 supported by the film substrate 101, which is made of copper foil, is tin-plated. The inner lead 100 is 8 $\mu$m to 12 $\mu$m in thickness. Also, the inner lead 100 is preferably formed within the range from 100 $\mu$m to 500 $\mu$m in length, extending from the end (edge) of the semiconductor chip 96, in accordance with a position where the bump electrode 98 is provided.

The shape of the bump electrode 98, which is not limited, is a rectangle with 60 $\mu$m to 120 $\mu$m long side and 15 $\mu$m to 40 $\mu$m short side, and as shown in FIG. 1(a), and the bump electrode 98 has a thickness of 10 $\mu$m to 18 $\mu$m, for example. The bump electrode 98 is made of gold and is bonded with the inner lead 100 by gold-tin bonding.

The shape of the semiconductor chip 96 in the COF, as shown in FIG. 2(a), which is not limited, is a rectangle with 8 mm to 22 mm long side and 1 mm to 2.5 mm short side, for example. As shown in FIG. 1(a), the semiconductor chip 96 includes bump electrodes 98a provided in the periphery thereof to be respectively parallel along the end of the semiconductor chip 96, which is the edge of the semiconductor chip 96, and to be, spaced at predetermined alignment pitches. Also, the semiconductor chip 96 includes bump electrodes 98b, which are different from the bump electrodes 98a in distance from the end of the semiconductor chip 96, provided to be parallel along the end of the semiconductor chip 96 and to be spaced at predetermined alignment pitches. More specifically, the semiconductor chip 96 includes the bump electrodes 98a and the bump electrodes 98b, which are different in distance from the end of the semiconductor chip 96, provided in two rows to be spaced at predetermined pitches.

Hereinafter, the bump electrode 98a arranged a relatively small distance apart from the end of the semiconductor chip 96 is referred to as outer-side bump electrode (edge-side bump electrode) 98a. The bump electrodes 98b arranged a relatively large distance apart from the end of the semiconductor chip 96 is referred to as inner-side bump electrode (inside bump electrode) 98b. Further, when either or both the outer-side bump electrode 98a and the inner-side bump electrode 98b are referred to, they are referred to as the bump electrode 98.

Note that, in the present embodiment, the following description will be given based on the arrangement in which, as shown in FIG. 1(a), one of the peripheries on the four sides included in the semiconductor chip 96 has the outer-side bump electrodes 98a and the inner-side bump electrodes 98b arranged in two rows, and each of the peripheries on the other three sides (hereinafter referred to as "the other sides") has the bump electrodes arranged in a single row. However, a periphery of at least one of the other sides may have the bump electrodes arranged in two rows.

As shown in FIG. 1(b), the outer-side bump electrodes 98a are spaced at alignment pitches larger than the inner-side bump electrodes 98b. That is, the distance between the outer-side bump electrodes 98a are larger than the distance between the inner-side bump electrodes 98b. In the present embodiment, the two inner-side bump electrodes 98b are provided so as to be sandwiched between the positions where the two adjacent outer-side bump electrodes 98a are provided. Therefore, the number of the inner-side bump electrodes 98b is equal to or more than the number of the outer-side bump electrodes 98a.

As shown in FIG. 1(a), the bump electrodes located at both ends among the inner-side bump electrodes 98b are arranged on the inward side of the bump electrodes placed at both ends among the outer-side bump electrodes 98a, so as to prevent the intersection with the bump electrodes arranged along the other sides of the semiconductor chip 96.

The outer-side bump electrode 98a and the inner-side bump electrode 98b placed on the semiconductor chip 96, as shown in FIG. 1(a), are electrically bonded to inner leads 100a and 100b, respectively, which are provided to the film substrate 101 (FIG. 2(a)). Note that, hereinafter, the inner lead 100a bonded with the outer-side bump electrode 98a is referred to as outer inner lead 100a, and the inner lead 100b bonded with the inner-side bump electrode 98b is referred to as inner inner lead (lead wire for inside bump electrode use) 100b. When either or both the outer inner lead 100a and the inner inner lead 100b are referred to, they are referred to as inner leads 100.

The outer inner lead 100a and the inner inner lead 100b extend from the end of the semiconductor chip 96 and are arranged respectively so as to be orthogonal to two respective opposite sides, which are parallel to the end of the semiconductor chip 96, of the outer-side bump electrode 98a and the inner-side bump electrode 98b. The outer inner lead 100a and the inner inner lead 100b are designed so as to be arranged in a linear manner on the outer-side bump electrode 98a and the inner-side bump electrode 98b, respectively, passing substantially through the midpoints of the two respective opposite sides of the outer-side bump electrode 98a and the inner-side bump electrode 98b.

Therefore, as shown in FIG. 1(b), the alignment pitch of the outer-side bump electrode 98a is substantially equal to a pitch $p(o)_1$ of the outer inner lead 100a bonded with the outer-side bump electrode 98a (hereinafter referred to as bonding pitch of the outer inner lead 100a). The alignment pitch of the inner-side bump electrode 98b is equal to a pitch $p(i)_1$ of the inner inner lead 100b bonded with the inner-side bump electrode 98b (hereinafter referred to as bonding pitch of the inner inner lead 100b).

In the present embodiment, as described previously, since the outer-side bump electrodes 98a and the inner-side bump electrodes 98b are arranged in two rows, the outer inner lead 100a must be provided so as not to come into contact with the inner-side bump electrode 98b. Further, in the present embodiment, as described previously, the two inner bump electrodes 98a are provided so as to be sandwiched between the positions where the two adjacent inner-side bump electrodes 98b are provided, the two inner inner leads 100b are placed between the outer-side bump electrodes 98a. Therefore, the two inner inner leads 100b placed between the outer-side bump electrodes 98a must be placed so as not to come into contact with each other and not to come into contact with the outer-side bump electrodes 98a.

More specifically, as shown in FIG. 1(a), the outer inner lead 100a placed on the outer-side bump electrode 98a extends in a linear manner from the end of the semiconductor chip 96 to the outer-side bump electrode 98a and is placed so as to intersect the two sides, which are parallel to the end of the semiconductor chip 96, of the outer-side bump electrode 98a. The leading end of the outer inner lead 100a on the semiconductor chip 96 is placed at a position before the position where the inner-side bump electrode 98b is provided.

Meanwhile, as to the inner inner lead 100b placed on the inner-side bump electrode 98b, as shown in FIG. 1(a), the two inner inner leads 100b placed between the outer-side bump electrodes 98a, extending from the end of the semiconductor chip 96, are placed in a linear manner between the outer-side bump electrodes 98a so as not to come into contact with each other and not to come into contact with the outer-side bump electrodes 98a. Further, in accordance with the position where the inner-side bump electrode 98b is placed, the inner inner lead 100b is bent between the position where the outer-side bump electrode 98a is placed and the position where the inner-side bump electrode 98b is placed, so that the bonding between the inner inner lead 100b and the inner-side bump electrode 98b is possible. With this arrangement, the inner inner lead 100b can linearly go across the two opposite sides, which are parallel to the end of the semiconductor chip 96, of the inner-side bump electrode 98b, so as to be bonded with the inner-side bump electrode 98b.

More specifically, to increase a distance between the two inner inner leads 100b placed between the outer-side bump electrodes 98a, the outer inner lead 100b is bent at the end of the passage between the outer-side bump electrodes 98a in accordance with the position where the inner inner lead 100b and the inner-side bump electrode 98b are bonded. Moreover, the inner inner lead 100b is further bent before the position where the inner-side bump electrode 98b is provided so that the inner inner lead 100b can intersect the two opposite sides of the inner-side bump electrode 98b.

As described above, the inner inner lead 98b is bent between the position where the outer-side bump electrode 98a is provided and the position where the inner-side bump electrode 98b is provided, thereby making the bonding pitch of the inner inner lead 100b different from a pitch at which the two inner inner leads 100b are placed between the outer-side bump electrodes 98a (hereinafter referred to as electrode-to-electrode pitch of the inner inner lead 100b). Especially, the electrode-to-electrode pitch of the inner inner lead 100b can be enough distance to keep the two inner inner leads 100b placed between the outer-side bump electrodes 98a from coming into contact with each other. Therefore, the electrode-to-electrode pitch of the inner inner lead 100b can be narrower than the bonding pitch of the inner inner leads 100b. This can increase the number of the inner inner leads 100b bonded with the inner-side bump electrode 98b.

Thus, a finer electrode-to-electrode pitch of the inner inner leads 100b provided between the outer-side bump electrodes 98a provides the bump electrodes 98 to be placed at high density, thus allowing for improvement in fine pitch of the bump electrodes 98 and improvement in fine pitch of the inner leads 100.

Note that, it is preferable that a radius of the inner inner lead 100b is within the range from 0.05 mm to 0.2 mm with respect to the position where the inner inner lead 100b is bent, so as to prevent breaks and cracks of the inner inner lead 100b occurring in bonding the inner inner lead 100b with the inner-side bump electrode 98b, as will be hereinafter described.

As described above, the distance between the outer-side bump electrodes 98a is a distance enough to keep the two inner inner leads 100b arranged between the outer-side bump electrodes 98a from coming into contact with each other and from coming into contact with the outer-side bump electrodes 98a.

Specifically, it is preferable that approximately 15 μm is secured for the distance between the outer-side bump electrodes 98a and the inner inner lead 100b. For improvement in fine pitch of the inner leads 100, it is preferable that the electrode-to-electrode pitch of the inner inner leads 100b is not more than 30 μm. Therefore, it is preferable that a width of the inner lead 100 is not more than 15 μm. This arrangement can prevent shorts and leak defects even when the outer inner lead 100a bonded on the outer-side bump electrode 98a deviates from the outer-side bump electrode 98a.

Next, the following will describe a method for manufacturing the above COF.

As the film substrate 101 of the COF, used is a substrate thick enough to be bent freely and thick enough to be resist transfer by an apparatus with sprocket holes 93, as shown in FIG. 2(a). The film substrate 101 preferably includes copper foil of 5 μm to 9 μm in thickness, or more preferably 8 μm or less in thickness, to form the inner leads 100. The film substrate 101 having copper foil is made up by the metalizing method of depositing metal such as Cr or Ni to a base material realized by the aforementioned polyimide organic material by sputtering and forming copper foil on the metal by plating. Alternatively, the film substrate 101 having copper foil may be made up by casting method of applying polymide varnish to copper foil and then curing it.

Then, the copper foil on the film substrate 101 is etched to form the inner leads 100 with desired interconnect patterns. For a thin film of the copper foil of 5 μm to 9 μm in thickness, as described above, it is possible to provide the inner leads 100 at fine pitches. The copper foil is formed so as to be supported by the film substrate 101, so that the inner leads 100 are fixed on the film substrate 101. This results in no defects such as deformation of the inner lead 100 and breaking of the inner lead 100 even when the inner lead 100 is as narrow as 1 μm to 15 μm in width, and even when the inner lead 100 is bent in accordance with the position where the inner-side bump electrode 98b is provided.

Specifically, when copper foil having a thickness of 5 μm is used, it is possible to provide the inner lead 100 having a width of not less than 1 μm nor more than 15 μm and to provide the inner leads 100 at a pitch of 15 μm. The inner leads 100 formed on the film substrate 101 by the above method can provide bond strength of 5N/cm or more between the film substrate 101 and the inner lead 100. Note that, variation in length of the inner lead 100 formed by the above method is ±20 μm.

After the inner leads 100 are formed in this manner, the solder resist 94 is formed so as to coat a predetermined area of the inner lead 100.

Figure 3:
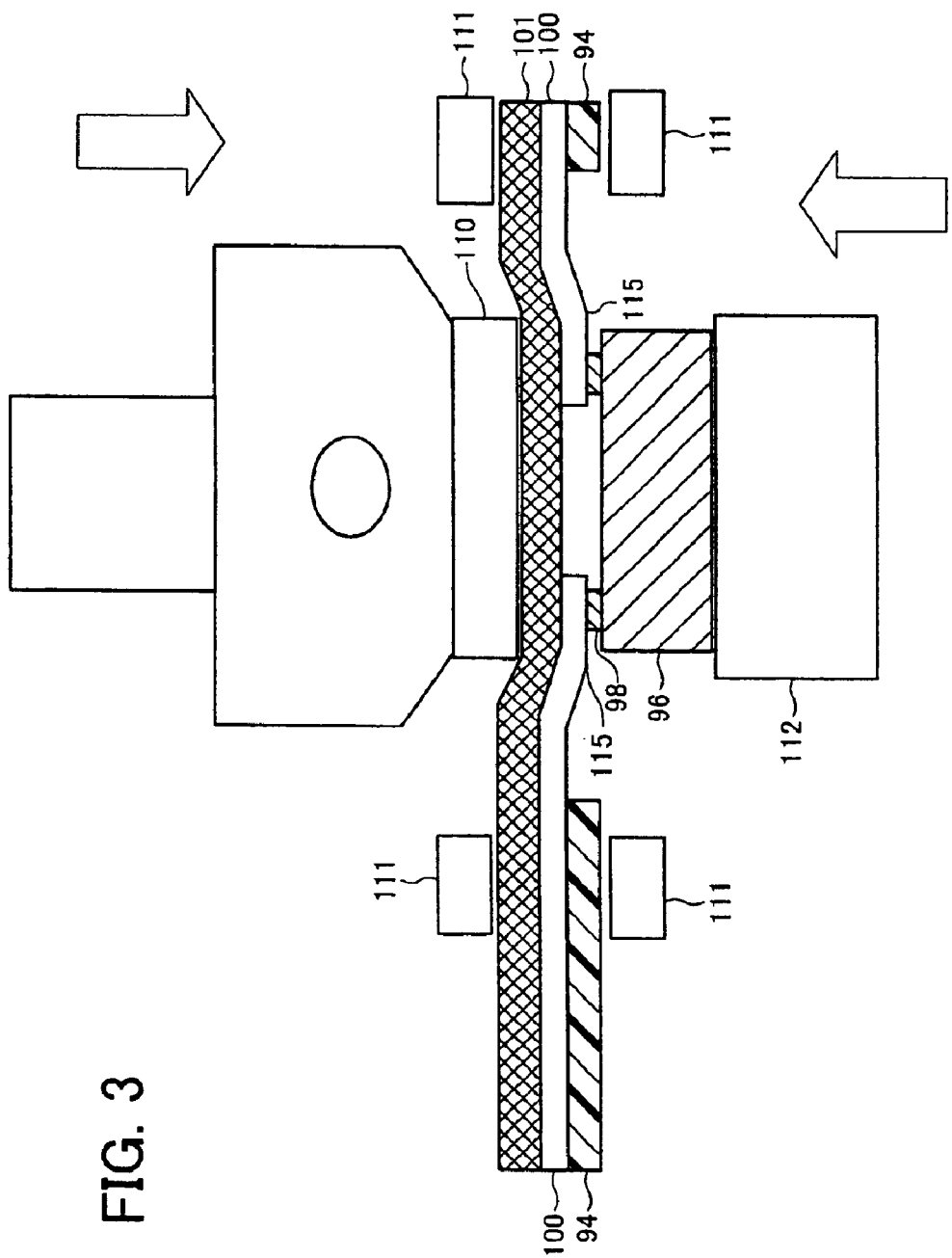
FIG. 3 is a cross-sectional view showing an inner lead bonding apparatus for use in bonding between a inner lead and a bump electrode in the COF of the present invention.
Figure 4:
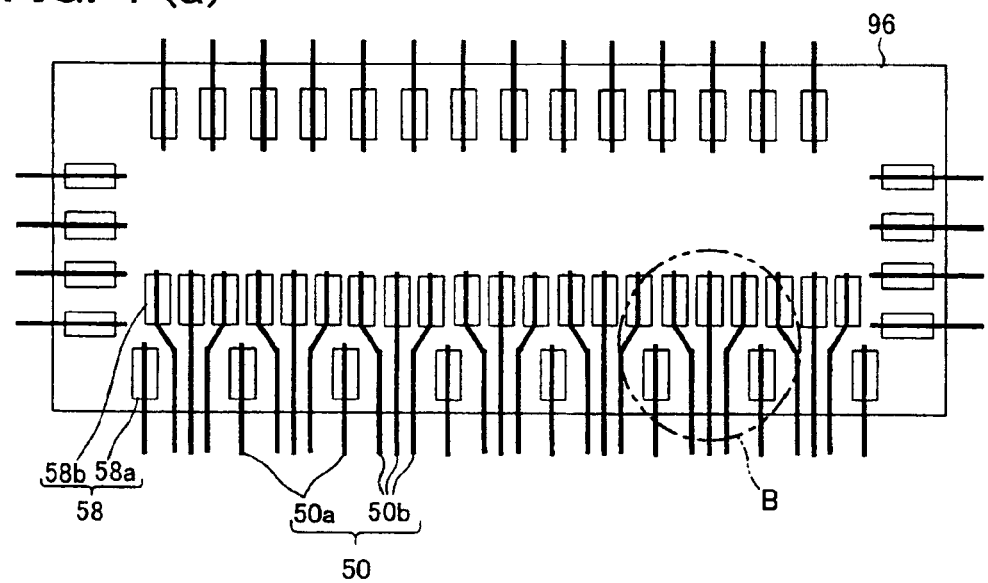
FIG. 4(a) is a plane view showing another embodiment of a COF in the present invention.
FIG. 4(b) is a plane view showing a primary part B in FIG. 4(a).
Figure 4:
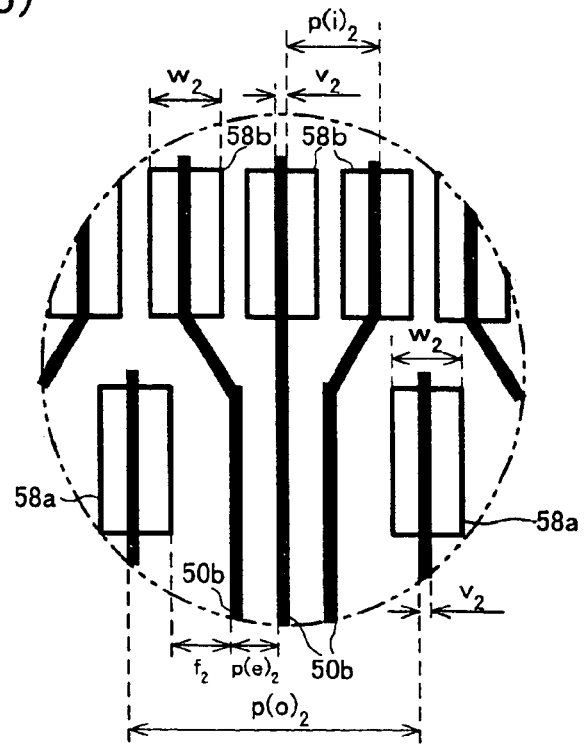

Then, the film substrate 101 with the inner lead 100 formed thereon is bonded with the semiconductor chip 96 with bump electrodes 98 formed thereon using an inner lead bonding apparatus. That is, as shown in FIG. 3, the semiconductor chip 96 is fixed onto a bonding stage 112 of the inner lead bonding apparatus. Further, using a fixed cramp 111 of the inner lead bonding apparatus, the film substrate 101 is fixed at the area where the solder resist 94 is formed on the inner lead 100. At this moment, the film substrate 101 and the semiconductor chip 96 are fixed so that the inner lead 100 on the film substrate 101 is opposed to the bump electrode 98 provided to the semiconductor chip 96.

Thereafter, the inner lead 100 on the film substrate 101 is aligned to the bump electrode 98 on the semiconductor chip 96, and as shown in FIG. 3, a heating tool 110 and the bonding stage 112 of the inner lead bonding apparatus are moved in the direction indicated by an arrow. Note that, for preferred implementation of the above alignment, a positioning raised part (not shown) shaped like protrusion 50 μm to 100 μm long may be provided so as to be orthogonal to the inner leads 100 located at both ends among the inner leads 100 shown in FIG. 1(a).

With this arrangement, by pinching the film substrate 101 and the semiconductor chip 96 between the heating tool 110 and the bonding stage 112, applying the resin 99 (FIG. 2(b)) to the position where the inner lead 100 and the bump electrode 98 are to be bonded, and then thermocompression bonding them for 0.5 to 3 seconds, the inner lead 100 and the bump electrode 98 are bonded with the resin 99. Note that, for the thermocompression bonding, the bonding stage 112 and the heating tool 110 are heated up to a predetermined temperature. In this manner, the tin on the surface of the inner lead 100 is electrically connected to the gold of the bump electrode 98 by metal-to-metal bonding.

As described above, the COF shown in FIG. 1(a) can be manufactured at a bonding accuracy of the conventional inner lead bonding apparatus. That is, the COF of the present embodiment, which is manufactured at the conventional bonding accuracy, can increase the number of bump electrodes mounted on the semiconductor chip 96 and improve a pitch between inner leads without defects such as deformation and breaking of the inner leads and leak defects.

Note that, since the inner lead bonding apparatus is used in the present embodiment, damage 115 to the inner lead 100 arranged on the end of the semiconductor chip 96 might occur due to stress caused during thermocompression bonding between the inner lead 100 and the bump electrode 98. This damage 115 causes breaks and cracks in the inner lead 100. Therefore, it is preferable that the inner lead 100 located on the end of the semiconductor chip 96 is provided so as to be in a linear manner on the film substrate 101.

Note that, in the COF shown in FIG. 1(a), since two inner-side bump electrodes 98b are placed so as to be sandwiched between the positions where two adjacent outer-side bump electrodes 98a are placed, two inner inner leads 100b are placed between the outer-side bump electrodes 98a. However, the present invention is not limited to this arrangement. That is, as shown in FIG. 4(a), three inner bump electrodes 58b may be provided so as to be sandwiched between the positions where the two adjacent outer bump electrodes 58a are placed. In this case, three inner inner leads 50b are placed between the outer bump electrodes 58a.

As in the aforementioned case, in the case where the three inner inner leads 50b are placed between the outer bump electrodes 58a, the three inner inner leads 50b placed between the outer bump electrodes 58a, extending from the end of the semiconductor chip 96, are placed in a linear manner so as not to come into contact with each other and not to come into contact with the outer bump electrodes 58a.

Further, as shown in FIG. 4(b), the two inner inner leads 50b placed at both ends among the three inner inner leads 50b are bent between the position where the outer-side bump electrode 58a is placed and the position where the inner-side bump electrode 58b is placed, so that the bonding between the inner inner lead 50b and the inner-side bump electrode 58b is possible. Meanwhile, the inner inner lead 50b placed in the middle among the three inner inner leads 50b placed between the outer-side bump electrodes 50a is placed in a linear manner without being bent, extending from the end of the semiconductor chip 96 to the inner-side bump electrode 58b.

This makes it possible to reduce alignment pitch of the outer-side bump electrodes 50a as well as alignment pitch of the inner-side bump electrodes 58b, thus allowing for the bump electrodes 58 mounted at high density on the semiconductor chip 96.

Note that, in the COF shown in FIG. 4(a), although the inner inner lead 50b placed in the middle among the three inner inner leads 50b placed between the outer-side bump electrodes 50a is placed in a linear manner without being bent, it may be bent as with the inner inner leads 50b placed at both ends. Alternatively, only one of the three inner inner leads 50b may be bent. That is, which of the inner inner leas 50b is bent, not especially limited, may be set in accordance with the positions where the outer-side bump electrode 50a and the inner-side bump electrode 50b are placed.

Also, the number of inner inner leads placed between the outer-side bump electrodes is not limited to two or three, and four or more inner inner leads are similarly applicable to this invention.

Furthermore, the present invention is not limited to the above-described embodiment, and various modifications are possible within the scope of the present invention. For example, although the method of forming the inner leads 100 using copper foil on the film substrate 101 has been given in the description of the present embodiment, the above method is also applicable to the case of forming interconnections other than the inner leads 100. In addition, other interconnections can be formed together with the inner leads 100.

Moreover, the present embodiment has been described with an example of COF; however, the present invention is not limited to this. That is, a film may be anything provided that it can ensure enough strength of inner lead, bonding strength between an inner lead and a film substrate, and others when inner leads are formed at pitches of 40 μm or less. Note that, in TCP (Tape Carrier Package) or the like, when inner leads are formed at pitches of 40 μm or less, there is the possibility that enough strength of inner lead could not be secured. Therefore, it is preferable to adopt COF or the like.

Embodiment 2

Figure 5:
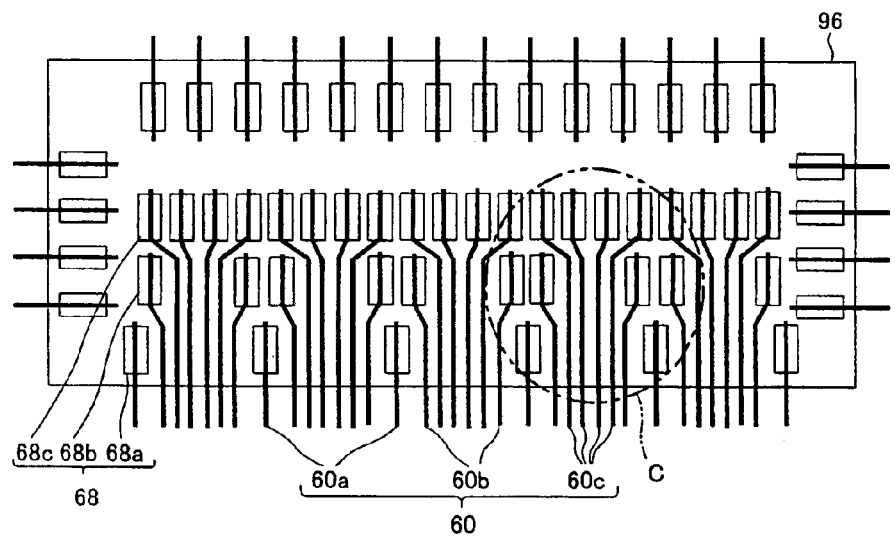
FIG. 5(a) is a plane view showing still another embodiment of a COF in the present invention.
FIG. 5(b) is a plane view showing a primary part C in FIG. 5(a).
Figure 5:
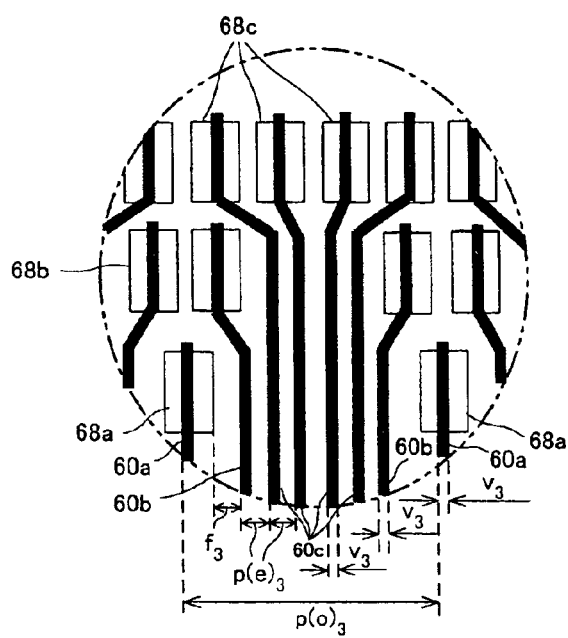

The following will describe another embodiment of the present invention with reference to FIG. 5. Note that, for the purpose of explanation, members having the same functions as those illustrated in drawings of Embodiment 1 are given the same reference numerals and explanations thereof are omitted here.

In a semiconductor chip 96 of the present embodiment, as shown in FIG. 5(a), bump electrodes spaced at predetermined pitches are arranged in three rows respectively at different distances from the end of the semiconductor chip 96. Hereinafter, the bump electrodes arranged in three rows are referred to as a first bump electrode (edge-side bump electrode) 68a, a second bump electrode (first inner-side bump electrode) 68b, and a third bump electrode (second inner-side bump electrode) 68c in the order of being relatively small distance apart from the end of the semiconductor chip 96. When any one or all of the first bump electrode 68a, the second bump electrode 68b, and the third bump electrode 68c are referred to, they are referred to as bump electrodes 68.

As described in Embodiment 1, among the second bump electrodes 68b and the third bump electrodes 68c, the bump electrodes placed at both ends are placed on the inward side of the bump electrodes placed at both ends among the first bump electrodes 68a, so as to prevent the intersection with the bump electrodes placed along the other sides of the semiconductor chip 96.

Further, the first bump electrode 68a, the second bump electrode 68b, and the third bump electrode 68c placed on the semiconductor chip 96 are electrically bonded with inner leads 60a, 60b, and 60c provided to the film substrate 101 (FIG. 2(a)), respectively. As described in Embodiment 1, each of the inner leads 60a, 60b, and 60c is placed so as to go across the two opposite sides, which are parallel to the end of the semiconductor chip 96, of the bump electrode 68, extending from the end of the semiconductor chip 96.

Note that, the inner lead 60a bonded with the first bump electrode 68a is referred to as first inner lead 60a, the inner lead 60b bonded with the second bump electrode 68b is referred to as second inner lead 60b, and the inner lead 60c bonded with the third bump electrode 68c is referred to as third inner lead 60c. Further, when any one or all of the first inner lead 60a, the second inner lead 60b, and the third inner lead 60c are referred to, they are referred to as inner lead 60.

As shown in FIG. 5(a), the first bump electrodes 68a are formed on the semiconductor chip 96 at such alignment pitches that the second inner leads 60b do not come into contact with the third inner leads 60c between the first bump electrodes 68a and the second inner leads 60b, and the third inner leads 60c do not come into contact with the first bump electrodes 68a.

The second bump electrodes 68b are formed on the semiconductor chip 96 in such a manner that the third inner leads 60c do not come into contact with the second bump electrodes 68b. That is, the second bump electrodes 68b are so provided that an electrode-to-electrode region where the third inner lead 60c is placed and an electrode-to-electrode region where the third inner lead 60c is not placed are alternately provided between the second bump electrodes 68b adjacent to each other.

Further, the third bump electrodes 68c are mounted on the semiconductor chip 96 at minimum alignment pitches set in view of the bonding accuracy of the inner lead bonding apparatus, described in Embodiment 1.

More specifically, as shown in FIG. 5(b), the first inner lead 60a placed on the first bump electrode 68a extends in a linear manner from the end of the semiconductor chip 96 to the first bump electrode 68a and is placed so as to go across the two sides, which are parallel to the end of the semiconductor chip 96, of the first bump electrode 68a. The leading end of the first inner lead 60a on the semiconductor chip 96 is placed at a position before the position where the second bump electrode 68b is provided.

Between the first bump electrodes 68a, placed are two second inner leads 60b and four third inner leads 60c. These six inner leads 60b and 60c extend in a linear manner from the end of the semiconductor chip 96 to the end of the passage between the first bump electrodes 68a. Among the six inner leads 60b and 60c, inner leads located at both ends are the second inner leads 60b, and four inner leads sandwiched between the second inner leads 60b are the third inner leads 60c.

The second inner lead 60b is bent between the position where the first bump electrode 68a and the position where the second bump electrode 68b so as to be placed on and bonded with the second bump electrode 68b. With this arrangement, it is possible to place the second inner lead 60b on the second bump electrode 68b so as to linearly go across the two opposite sides, which are parallel to the end of the semiconductor chip 96, of the second bump electrode 68b and then bond between the second bump electrode 68b and the second inner lead 60b. The leading end of the second inner lead 60b linearly going across the two opposite sides is placed on the semiconductor chip 96 at a position before the position where the third bump electrode 68c is provided. With this arrangement, the second inner lead 60b avoids coming into contact with the third bump electrode 68c.

Thus, among the inner leads 60b and 60c placed between the first bump electrodes 68a, the inner leads 60b located at both ends are bonded to the second bump electrodes 68b. Therefore, as shown in FIG. 5(a), the second bump electrodes 68b are so placed that a region where the third inner lead 60c is placed and a region where the inner lead 60 is not placed are alternately provided between the second bump electrodes 68b.

Moreover, the third inner lead 60c arranged between the first bump electrodes 68a and between the second bump electrodes 68b is bent between the position where the second bump electrode 68b is provided and the position where the third bump electrode 68c is provided. With this arrangement, it is possible to place the third inner lead 60c on the third bump electrode 68c so as to intersect the two opposite sides, which are parallel to the end of the semiconductor chip 96, of the third bump electrode 68c. Note that, since the inner lead 60 is not placed between the third bump electrodes 68c, a distance between the third bump electrodes 68c may be set in accordance with alignment pitch set in view of bonding accuracy, as described above.

As described above, since an inner lead is bent to bond between a bump electrode and the inner lead, a pitch of inner leads placed between the bump electrodes (hereinafter referred to as electrode-to-electrode pitch of inner leads) can be a fine pitch. When at least one inner lead is placed between the bump electrodes, alignment pitch is determined depending on the number of inner leads between the bump electrodes. Therefore, as shown in FIG. 5(a), alignment pitch of the first bump electrodes 68a on the semiconductor chip 96 is larger than alignment pitch of the third bump electrodes 68c. Furthermore, the number of bump electrodes provided on the semiconductor chip 96 varies depending on the number of inner leads between bump electrodes. In the COF shown in FIG. 5(a), the number of bump electrodes increases in the following order: the first bump electrode 68a; the second bump electrode 68b; and the third bump electrode 68c. Increase in the number of bump electrodes from the outer side to the inner side of the semiconductor chip 96 facilitates the bonding between the bump electrode 68 and the inner lead 60. Further, this allows for the bump electrodes 68 mounted at high density on the semiconductor chip 96 and allows for improvement in fine pitch of the inner leads 60 bonded with the bump electrode 68.

Note that, in the present embodiment, although all the inner leads 60 to be bonded with the second bump electrode 68b and the third bump electrode 68c are bent, an inner lead not being bent may be used in accordance with the position where the bump electrode 68 is placed. That is, as in the case of the COF shown in FIG. 4(a) and FIG. 4(b) described in Embodiment 1, there can be the case where the inner lead is placed in a linear manner without being bent, extending from the end of the semiconductor chip to the bump electrode.

Moreover, in the COF shown in FIG. 5(a), the bump electrodes are so arranged in three rows so as to be different from one another in distance from the end of the semiconductor chip. However, the present invention is not limited to this arrangement, and the bump electrodes may be arranged in four or more rows. That is, the second bump electrode 68b may be provided in two or more rows between the first bump electrodes 68a and between the third bump electrodes 68c.

Alternatively, the bump electrodes placed at random on the semiconductor chip allow for improvement in fine pitch. That is, the inner lead appropriately bent in accordance with the position where the bump electrode is provided allows for improvement in fine pitch of the inner leads.

Embodiment 3

Figure 6:
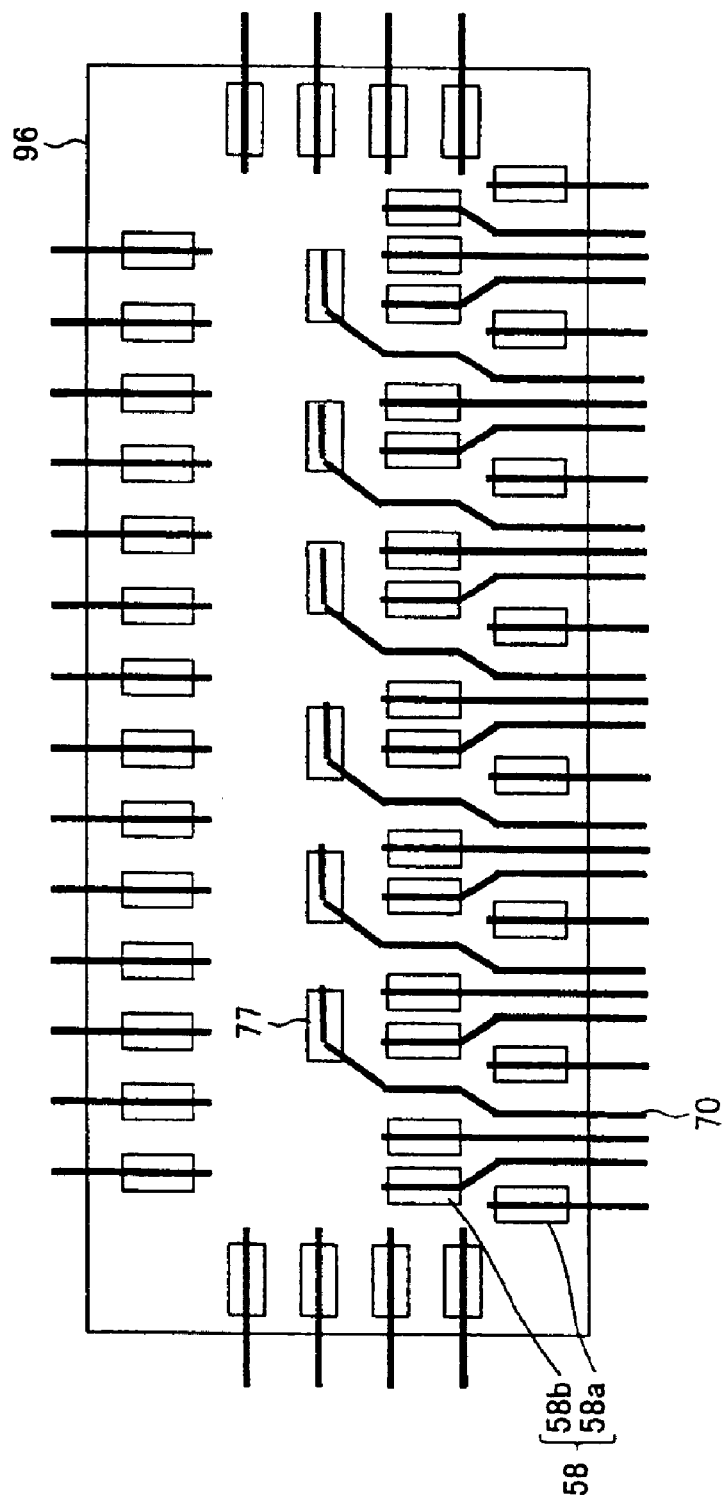
FIG. 6 is a plane view showing yet another embodiment of a COF in the present invention.
Figure 7:
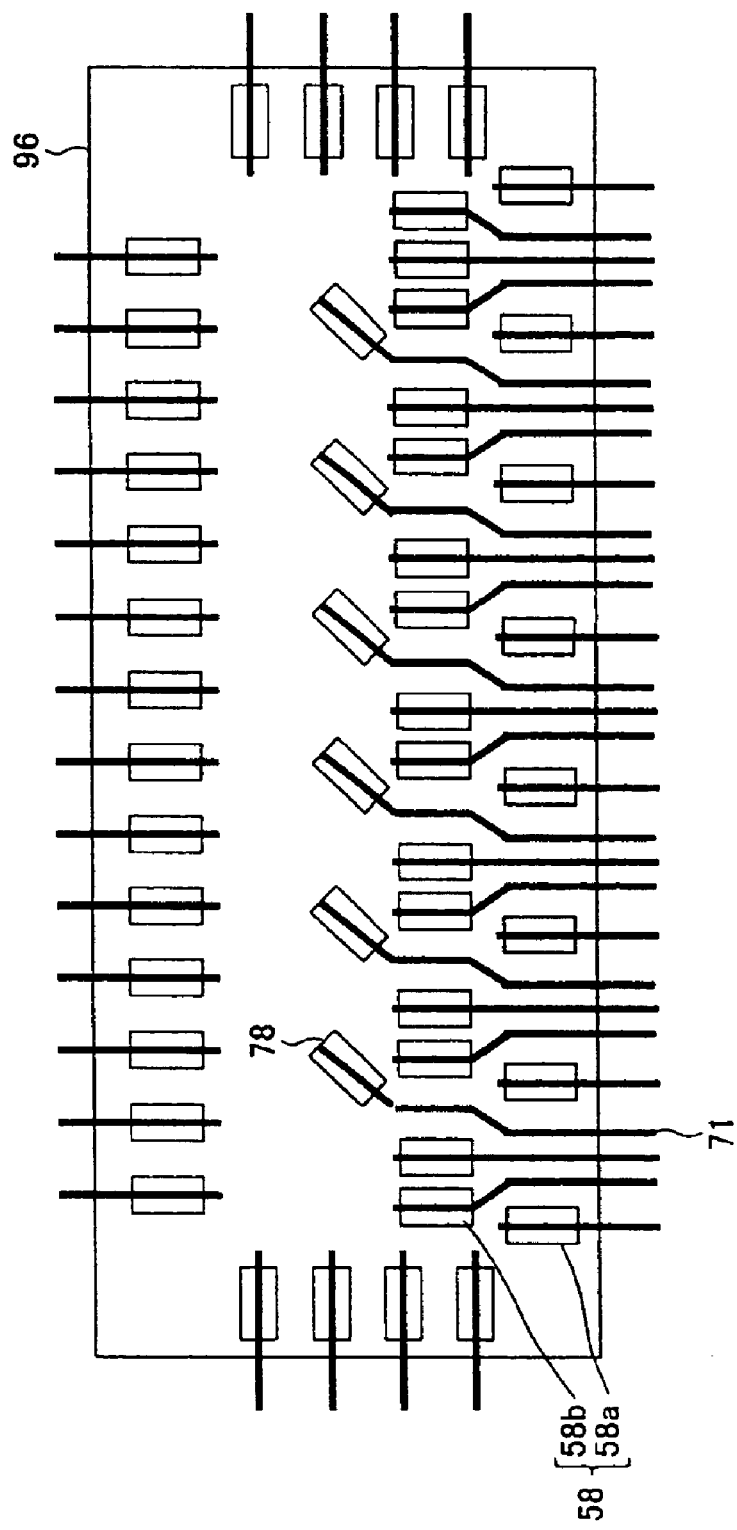
FIG. 7 is a plane view showing another embodiment of a COF in the present invention.

The following will describe still another embodiment of the present invention with reference to FIG. 6 and FIG. 7. Note that, for the purpose of explanation, members having the same functions as those illustrated in drawings of Embodiments 1 and 2 are given the same reference numerals and explanations thereof are omitted here.

In a COF of the present embodiment, some of the inner-side bump electrodes 58b in the COF shown in FIG. 4(a), which has been described in Embodiment 1, are placed so as to be different from the others in distance from the end of the semiconductor chip 96. More specifically, as shown in FIG. 6, a bump electrode 77 is placed at a position more distant than the position of the inner-side bump electrode 58b from the end of the semiconductor chip 96. Moreover, the bump electrode 77 is placed in a different direction from a direction in which the outer-side bump electrode 58a and the inner-side bump electrode 58b are provided. That is, the bump electrode 77 is so provided that two opposite sides, which an inner lead 70 intersects, of the bump electrode 77 are perpendicular to two opposite sides, which the inner lead 50 intersect, of the inner-side bump electrode 58b.

In this case, in the COF shown in FIG. 6, the inner lead 70 is placed at the position where the inner-side bump electrode 58b has been placed in the COF shown in FIG. 4(a), and the inner lead 70 is bent between the inner-side bump electrode 58b and the bump electrode 77.

Thus, for a change in the position where the bump electrode 77 and the inner lead 70 are bonded, the inner lead 70 is bent in accordance with the position where the bump electrode 77 is provided, thereby realizing the bump electrodes with fine pitches on the semiconductor chip 96.

Moreover, the direction in which the bump electrode is provided must be changed depending on the positions where a semiconductor element and a chip interconnection (both not shown) are placed on the semiconductor chip 96. That is, the semiconductor element and the chip interconnection are placed on the semiconductor chip 96, and bump electrodes are provided on the semiconductor element. Therefore, the positions where the bump electrodes are provided depend on the position where the semiconductor element is placed. However, bending of the inner lead 70 realizes improvement in fine pitch of the bump electrodes regardless of the positions where the semiconductor element and the chip interconnection are placed.

Alternatively, as shown in FIG. 7, a bump electrode 78 can be placed so as to be at a 45 degree angle with respect to the two opposite sides, which an inner lead 71 intersects, of the inner-side bump electrode 58b. Also in this case, in accordance with the position where the bump electrode 78 is provided and the direction in which the bump electrode 78 is provided, the inner lead 71 is bent between the inner-side bump electrode 58b and the bump electrode 78.

As described above, for an arbitrary change in the position where the bump electrode is provided and the direction in which the bump electrode is provided on the semiconductor chip, arbitrary bending of the inner lead allows for improvement in fine pitch of the inner leads.

That is, as described above, at least some of the inside bump electrodes may be provided in a different direction from the direction in which the edge-side bump electrode is provided. With this arrangement, lead wires for inside bump electrode use are bent, so that the lead wires for inside bump electrode use can be bonded with bump electrodes provided in various directions. Therefore, lead wires connected to a semiconductor chip having inside bump electrodes provided in various directions can be provided at fine pitches.

Note that, the present embodiment has been described based on the arrangement in which an inner lead is placed at the position where the inner-side bump electrode 58b has been placed in the COF shown in FIG. 4(a). However, the present invention is not limited to this arrangement. That is, the present invention is applicable to the COF shown in FIG. 1(a) and FIG. 5(a) used in the aforementioned embodiments. Moreover, alignment pitch of the inner-side bump electrodes 58b shown in FIG. 6 and FIG. 7 can be changed appropriately, and the directions in which the bump electrodes 77 and 78 are placed are not limited to the directions indicated in FIG. 6 and FIG. 7.

Embodiment 4

Figure 8:
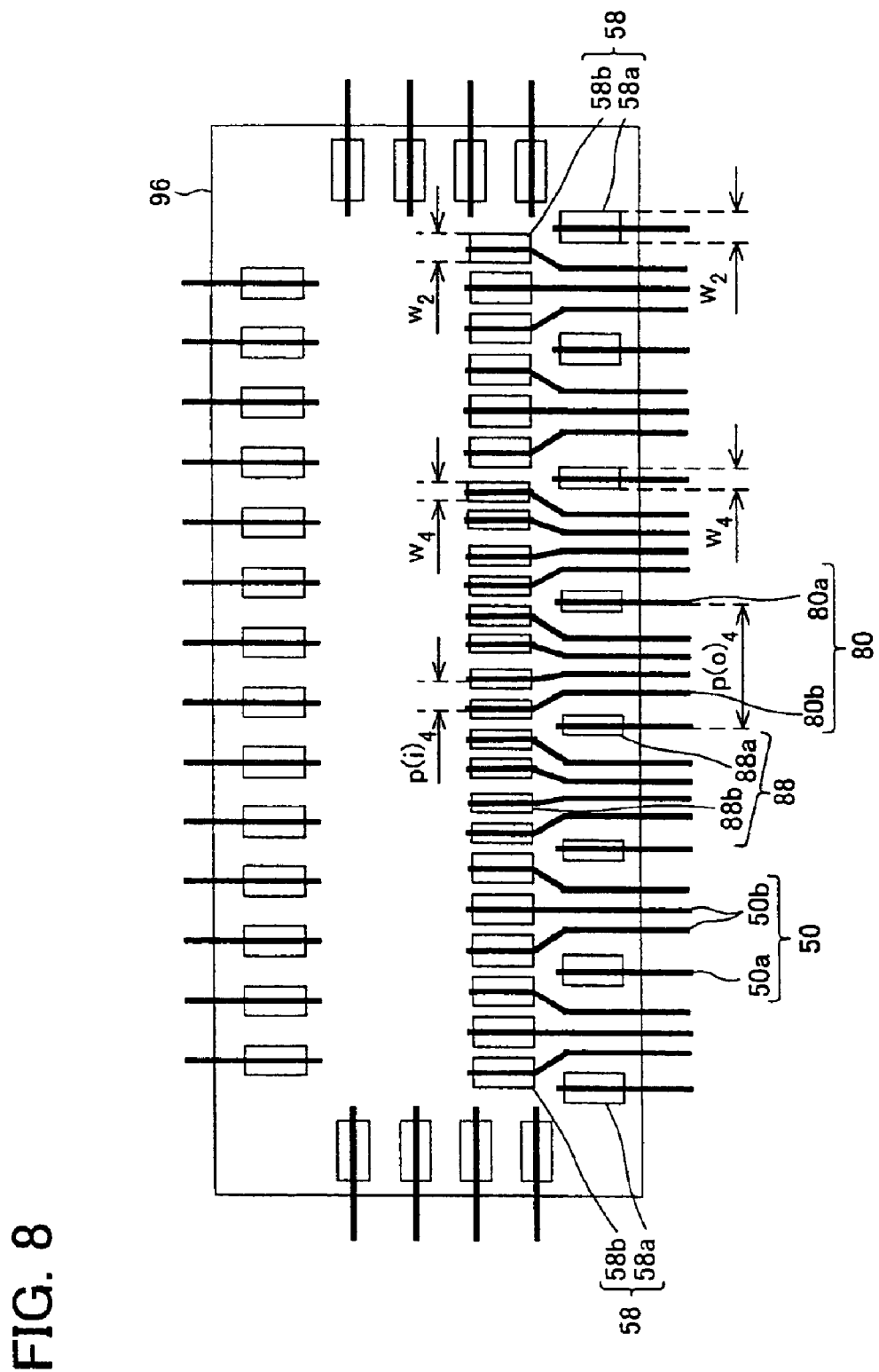
FIG. 8 is a plane view showing still another embodiment of a COF in the present invention.
Figure 9:
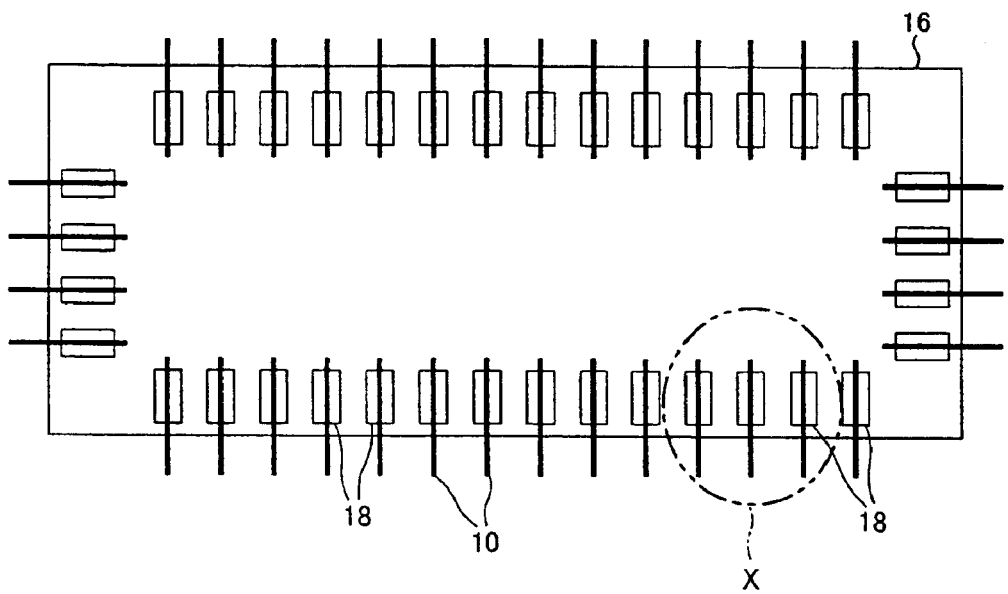
FIG. 9(a) is a plane view showing a conventional COF.
FIG. 9(b) is a plane view showing a primary part X in FIG. 9(a).
Figure 9:
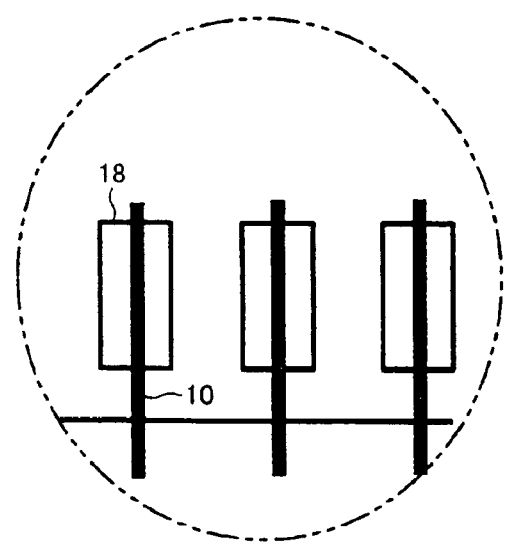
Figure 10:
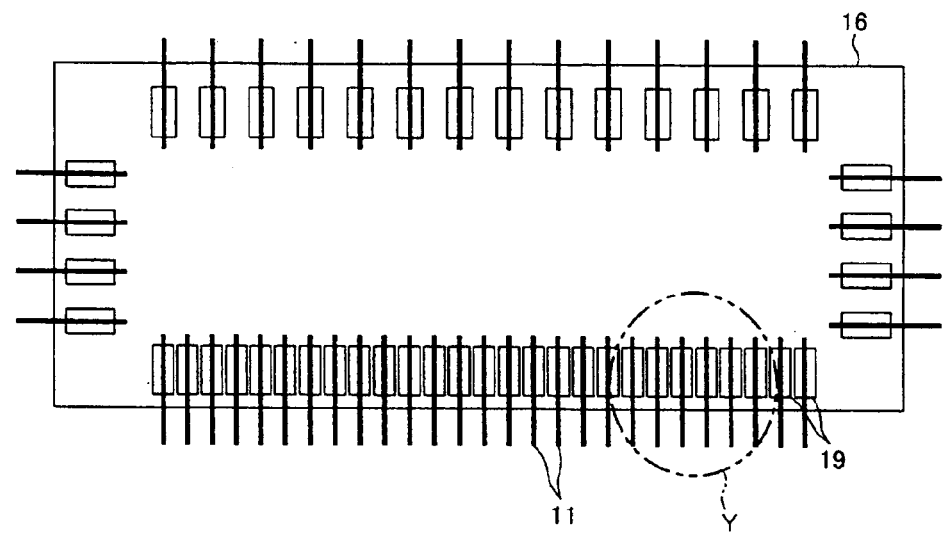
FIG. 10(a) is a plane view showing another conventional COF.
FIG. 10(b) is a plane view showing a primary part Y in FIG. 10(a).
Figure 10:
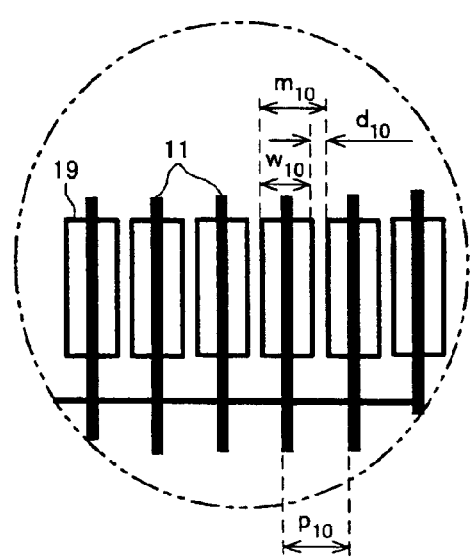
Figure 11:
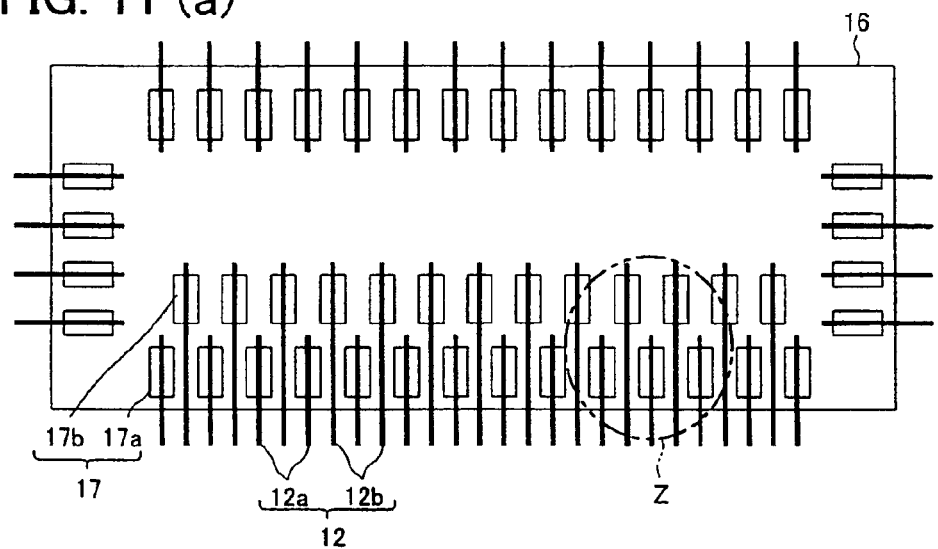
FIG. 11(a) is a plane view showing still another conventional COF.
FIG. 11(b) is a plane view showing a primary part Z in FIG. 11(a).
Figure 11:
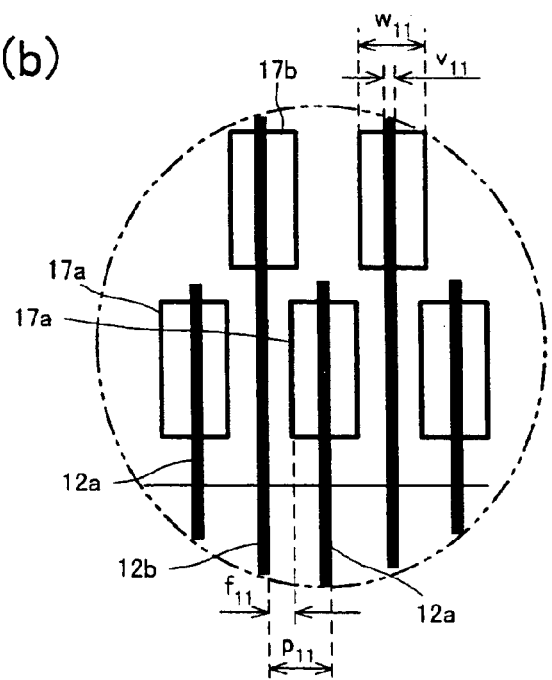

The following will describe yet another embodiment of the present invention with reference to FIG. 8. Note that, for the purpose of explanation, members having the same functions as those illustrated in drawings of Embodiments 1 through 3 are given the same reference numerals and explanations thereof are omitted here.

In a semiconductor chip 96 of the present embodiment, as shown in FIG. 8, bump electrodes are arranged in two rows respectively at different distances from the end of the semiconductor chip 96. Among the bump electrodes in each row, bump electrodes 58 placed in both-ends regions located at both ends (hereinafter referred to as both-ends region bump electrodes) have relatively large widths and are provided at relatively large alignment pitches. On the other hand, bump electrodes 88 placed in a region sandwiched between the both-ends regions (hereinafter referred to as central region) (hereinafter referred to as central region bump electrodes) have relatively small widths and are provided at relatively small alignment pitches. Outer-side bump electrode 88a and inner-side bump electrode 88b both located in the central region are referred to as central region outer-side bump electrode 88a and central region inner-side bump electrode 88b, respectively.

Note that, hereinafter, the bump electrodes are referred to as outer-side bump electrode 58a, 88a and inner-side bump electrode 58b, 88b in the order of being relatively small distance apart from the end of the semiconductor chip 96. When either or both of the outer-side bump electrode 58a, 88a and inner-side bump electrode 58b, 88b are referred to, they are referred to as bump electrode 55, 88.

The outer-side bump electrodes 58a, 88a placed on the semiconductor chip 96 are electrically bonded with outer inner lead 50a, 80a provided to the film substrate 101 (FIG. 2(a)), respectively. The inner-side bump electrodes 58b, 88b placed on the semiconductor chip 96 are electrically bonded with inner inner leads 50b, 80b provided to the film substrate 101, respectively. As described in Embodiments 1 through 3, each of the outer inner leads 50a, 80a and the inner inner leads 50b, 80b is placed so as to go across the two opposite sides, which are parallel to the end of the semiconductor chip 96, of the bump electrode, extending from the end of the semiconductor chip 96.

The outer-side bump electrodes 58a, 88a are mounted on the semiconductor chip 96 respectively at such alignment pitches that the inner inner leads 50b, 80b between the outer-side bump electrodes 58a, 88a do not come into contact with one another and do not come into contact with the outer-side bump electrodes 58a, 88a, respectively. Moreover, the outer-side bump electrodes 58b, 88b are mounted on the semiconductor chip 96 at minimum alignment pitches set in view of the bonding accuracy of the inner lead bonding apparatus, described in Embodiment 1.

More specifically, as shown in FIG. 8, the outer inner leads 50a, 80a placed respectively on the outer-side bump electrodes 58a, 88a extend in a linear manner from the end of the semiconductor chip 96 to the outer-side bump electrodes 58a, 88a, respectively, and are placed so as to go across the respective two sides, which are parallel to the end of the semiconductor chip 96, of the outer-side bump electrodes 58a, 88a. The leading ends of the outer inner leads 50a, 80a on the semiconductor chip 96 are placed at the respective positions before the positions where the inner-side bump electrodes 58b, 88b are provided.

Between the both-ends region outer-side bump electrodes 58a, three inner inner leads 50b are placed. On the other hand, between the central region outer-side bump electrodes 88a, four inner inner leads 80b are placed. These inner inner leads 50b, 80b are placed in a linear manner from the end of the semiconductor chip 96 to the ends of the passage between the outer-side bump electrodes 58a, 88a. As described in Embodiment 1, the inner inner leads 50b, 80b are bent between the positions where the outer-side bump electrodes 58a, 88a are provided and between the positions where the inner-side bump electrode 58b, 88b are provided, respectively. With this arrangement, the inner inner leads 50b, 80b are placed on the inner-side bump electrodes 58b, 88b so as to linearly go across the two respective opposite sides, which are parallel to the end of the semiconductor chip 96, of the inner-side bump electrodes 58b, 88b, so as to be bonded with the inner-side bump electrodes 58b, 88b.

Thus, by reducing a width of the central region bump electrode 88 and further providing the central region bump electrode 88 at finer pitches than the both-ends region bump electrode 58, improvement in fine pitch of the bump electrodes 58, 88 on the semiconductor chip 96 is possible.

Especially, as described in Embodiment 1, when the bump electrode and the inner lead are bonded with each other by thermocompression bonding, it is preferable to make alignment pitch of the bump electrode in the central region different from alignment pitch of the bump electrode in the both-ends region, as described above.

That is, when the bump electrode and the inner lead are bonded with each other by thermocompression bonding using the inner lead bonding apparatus, the film substrate 101 (FIG. 2(a)) is usually heated to 400° C. or higher. This heating causes the thermal expansion of the film substrate 101, resulting in approximately 10 μm to 20 μm stretch of the film substrate 101. This stretch of the film substrate 101 causes variations in the positions of the inner leads 50, 80 provided on the film substrate 101. The variations cause displacement between the bump electrodes 58, 88 and the inner films 50, 80 in bonding them. Such a displacement tends to occur between the both-ends region bump electrode 58 and the inner film 50 rather than between the central region bump electrode 88 and the inner film 80.

In this connection, the central region bump electrode 88 in which the displacement relatively less occurs is provided at a finer pitch than the both-ends region bump electrode 58 in which the displacement tends to occur. Thus, a width and alignment pitch of the bump electrode are controlled in accordance with a tendency of the occurrence of the displacement, thereby allowing for reduction of shorts and leak defects in the inner lead and allowing for further improvement in fine pitch.

As described above, since an inner lead is bent to bond between the bump electrode and the inner lead, an electrode-to-electrode pitch of inner leads placed between the bump electrodes can be a fine pitch, and it is possible to reduce alignment pitch of the bump electrodes. Moreover, since widths and alignment pitches of the both-ends region bump electrode and the central region bump electrode are varied in accordance with bonding accuracy between the inner lead and the bump electrode, it is possible to enhance the reliability of connection between the inner lead and the bump electrode. Note that, a width of the both-ends region bump electrode is 5 $\mu$m or more larger than a width of the central region bump electrode.

Thus, in a semiconductor device of the present invention, the number of the lead wires for inside bump electrode use which are provided between the edge-side bump electrodes placed at least at both ends and their adjacent positions among the edge-side bump electrodes may be less than the number of the lead wires for inside bump electrode use which are provided between the edge-side bump electrodes placed at positions other than the both ends.

As to the lead wires and the bump electrodes placed in a region other than both ends, shifted bonding positions relatively less occur in bonding between the bump electrode and the lead wire. On the other hand, as to the lead wires and the bump electrodes placed at both ends and their adjacent positions, shifted bonding positions tend to occur in bonding between the bump electrode and the lead wire. Shifted bonding positions cause the occurrence of shorts and leak defects in the lead wire.

Therefore, by employing the above arrangement, the number of lead wires for inside bump electrode use is reduced for the bump electrodes at both ends and their adjacent positions where shifted bonding positions tend to occur, thereby preventing shorts and leak defects in the lead wire. Moreover, the number of lead wires for inside bump electrode use is increased for the bump electrodes in a region other than both ends and their adjacent positions where shifted bonding positions less occur, thereby providing the lead wires at fine pitches. This prevents shorts and leak defects in the lead wires and allows for improvement in fine pitch of the lead wires.

Moreover, in the semiconductor device of the present invention, respective widths of the edge-side bump electrodes and the inside bump electrodes placed at least at both ends among the edge-side bump electrodes and the inside bump electrodes may be larger than respective widths of the edge-side bump electrodes and the inside bump electrodes placed at positions other than the both ends.

According to the above arrangement, widths of the bump electrodes are varied in accordance with the tendency of the occurrence of shifted bonding positions between the bump electrode and the lead wire. This can prevent shorts and leak defects in the lead wires with the bump electrodes placed at both ends where shifted bonding positions tend to occur. Also, it is possible to improve fine pitch of the bump electrodes placed in a region other than both ends where shifted bonding positions less occur.

As described in Embodiments 1 through 4, in the semiconductor device of the present invention, it is preferable that the lead wire for inside bump electrode use between the edge-side bump electrodes has a width of not less than 1 $\mu$m nor more than 15 $\mu$m. Moreover, in the semiconductor device of the present invention, it is preferable that a distance between the edge-side bump electrodes is not less than 50 $\mu$m nor more than 150 $\mu$m. Further, in the semiconductor device of the present invention, it is preferable that when bonded with the inside bump electrode, the lead wire for inside bump electrode use is not less than 100 $\mu$m nor more than 500 $\mu$m in length, extending from the edge of the semiconductor chip to an inside end of the inside bump electrode.

With the above arrangements, it is possible to improve fine pitch of lead wires bonded with the inside bump electrodes and the edge-side bump electrodes. Specifically, it is possible to substantially provide a 35 $\mu$m or less pitch of the lead wires along the edge of, the semiconductor chip.

Further, in the semiconductor device of the present invention, it is preferable that in the above semiconductor device, at least some of the inside bump electrodes are connected to at least one of a semiconductor element and a chip interconnection on the semiconductor chip.

With the above arrangement, when the inside bump electrodes are placed in accordance with a position where the semiconductor element is placed, the lead wires for inside bump electrode use can be bonded in accordance with a position where the inside bump electrode is placed.

The present invention is not limited to the aforementioned embodiments and is susceptible of various changes within the scope of the accompanying claims. An embodiment obtained by suitable combinations of technical means disclosed in the different embodiments also fall within the technical scope of the present invention.

The following will be described the present invention in details based on examples. However, the present invention is not limited to this.

EXAMPLE 1

For the formation of the COF shown in FIG. 1(*a*), as shown in FIG. 1(*b*), the outer-side bump electrode 98*a* and the inner-side bump electrode 98*b* each having a width $w_1$ of 25 $\mu$m were formed on the semiconductor chip 96. Moreover, the two inner inner leads 100*b* each having a width of 15 $\mu$m were arranged at an electrode-to-electrode pitch p(e)$_1$ of 30 $\mu$m between the outer-side bump electrodes 98*a*. To make 15 $\mu$m of a distance $f_1$ between the inner inner lead 100*b* and the outer-side bump electrode 98*a*, the outer-side bump electrodes 98*a* were formed at an alignment pitch of 100 $\mu$m on the semiconductor chip 96. Further, the inner-side bump electrodes 98*b* were formed at an alignment pitch of 50 $\mu$m to secure at least 15 $\mu$m for a distance between the inner-side bump electrodes 98*b*.

Figure 2:
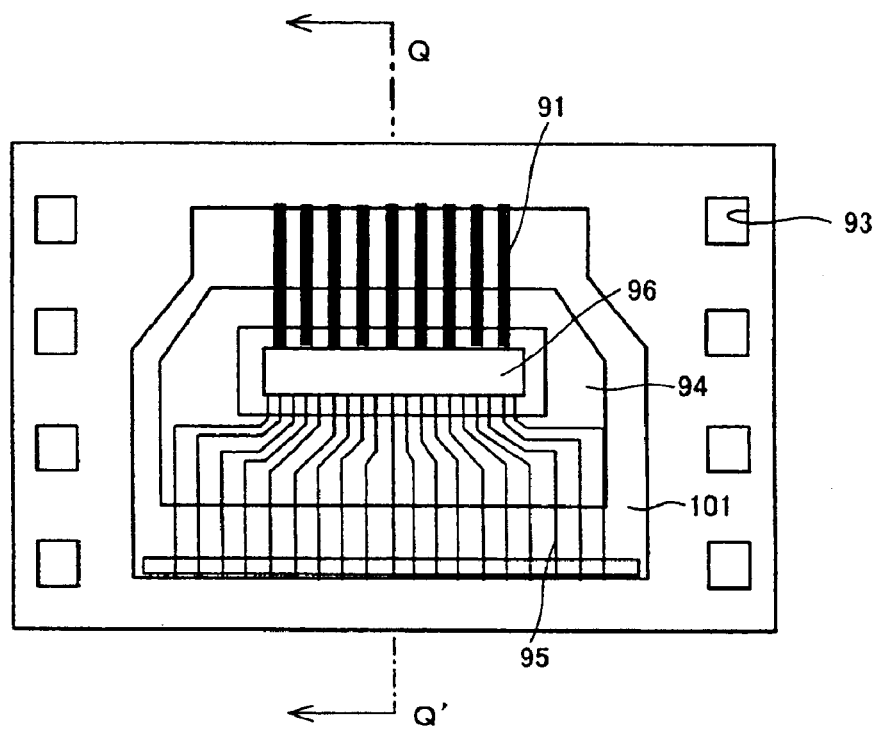
FIG. 2(a) is a top surface view of the COF and FIG. 2(b) is a cross-sectional view showing a part taken along a line Q–Q' in FIG. 2(a).
Figure 2:
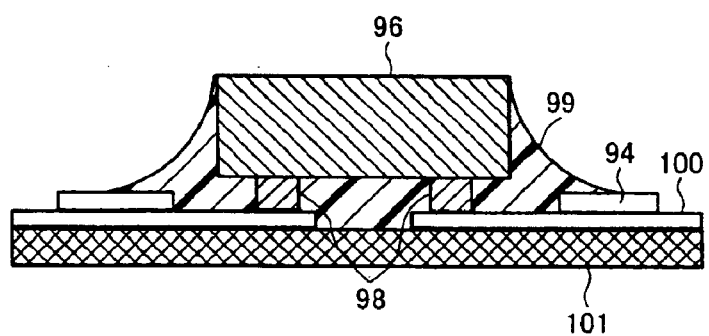

Copper foil having a thickness of 5 $\mu$m formed on the film substrates 101 (FIG. 2(*a*)) respectively having a thickness of 40 $\mu$m, 38 $\mu$m, and 25 $\mu$m, was etched, thereby forming inner lead 100 having a width $v_1$ of 15 $\mu$m which is of a wiring pattern depending on the arrangement of the bump electrode 98 formed on the semiconductor chip 96.

The bump electrode 98 and the inner lead 100 were bonded with each other using the inner lead bonding apparatus (FIG. 3), thereby obtaining the COF shown in FIG. 1. In the obtained COF, the outer inner leads 100*a* were formed at a pitch p(o)$_l$ of 100 $\mu$m. Moreover, the inner inner leads 100*b* were formed at a bonding pitch p(i)$_1$ of 50 $\mu$m.

Consequently, a substantial inner lead pitch (described later) became 100 $\mu$m/3=33.3 $\mu$m, which realized improvement in fine pitch. The bump electrode 98 and the inner lead 100 could be bonded with each other at a bonding accuracy of the conventionally well-known inner lead bonding apparatus. Note that, in the bonding, the two inner inner leads 100b formed at the electrode-to-electrode pitch $p(e)_1$ of 30 μm did not peel, deform, or come into contact with each other.

Note that, the substantial inner lead pitch is a pitch of inner leads at the edge part of the semiconductor chip 96 with the assumption that the outer inner leads 100 and the inner inner lead 100 are formed at a predetermined pitch. In the present example, since the electrode-to-electrode pitch $p(e)_1$ of the two inner inner leads arranged between the outer-side bump electrodes is 30 μm, the above substantial inner lead is not identical with an actual inner lead pitch. That is, in the present example, the outer inner leads and the two inner inner leads are not arranged at equal intervals between the outer-side bump electrodes, a distance between the outer inner lead and the inner inner lead is different from a distance between the inner inner leads. However, since the substantial inner lead pitch gives an indication of a fine pitch when the degree of fine pitch is evaluated, the substantial inner lead pitch is used as evaluation value in the present example and the following examples.

EXAMPLE 2

For the formation of the COF shown in FIG. 4(a), as shown in FIG. 4(b), the outer-side bump electrode 58a and the inner-side bump electrode 58b each having a width $w_2$ of 25 μm were formed on the semiconductor chip 96. Moreover, the three inner inner leads 50b each having a width of 15 μm were arranged at an electrode-to-electrode pitch $p(e)_2$ of 30 μm between the outer-side bump electrodes 58a. To make 15 μm of a distance $f_2$ between the inner inner lead 50b and the outer-side bump electrode 58a, the outer-side bump electrodes 58a were formed at an alignment pitch of 130 μm on the semiconductor chip 96. Further, the inner-side bump electrodes 58b were formed at an alignment pitch of 43.3 μm to secure at least 15 μm for a distance between the inner-side bump electrodes 58b.

As in Example 1, copper foil having a thickness of 5 μm formed on the film substrate 101 (FIG. 2(a)) was etched, thereby forming inner lead 50 having a width $v_2$ of 15 μm which is of a wiring pattern depending on the arrangement of the bump electrode 58 formed on the semiconductor chip 96, and the inner leads 50b were arranged at a pitch of 20 μm.

The bump electrode 58 and the inner lead 50 were bonded with each other using the inner lead bonding apparatus (FIG. 3), thereby obtaining the COF shown in FIG. 4(a). In the obtained COF, the outer inner leads 50a were formed at a pitch $p(o)_2$ of 130 μm. Moreover, the inner inner leads 50b were formed at a bonding pitch $p(i)_2$ of 35 μm, which is the same as the alignment pitch of the inner-side bump electrodes 58b.

Consequently, a substantial inner lead pitch became 130 μm/4=32.5 μm, which realized improvement in fine pitch. The bump electrode and the inner lead could be bonded with each other at a bonding accuracy of the conventionally well-known inner lead bonding apparatus. Note that, in the bonding, the three inner inner leads 50b formed at the electrode-to-electrode pitch $p(e)_2$ of 20 μm did not peel, deform, or come into contact with one another.

EXAMPLE 3

For the formation of the COF shown in FIG. 5(a), as shown in FIG. 5(a), the first bump electrode 68a, the second bump electrode 68b, and the third bump electrode 68c each having a width of 25 μm were formed on the semiconductor chip 96. Moreover, the six second inner leads 60b and third inner leads 60c in all each having a width of 15 μm were arranged at an electrode-to-electrode pitch $p(e)_3$ of 30 μm between the first bump electrodes 68a. To make 15 μm of a distance $f_3$ between the second inner lead 60b and the first bump electrode 68a, the first bump electrodes 68a were formed at an alignment pitch of 220 μm on the semiconductor chip 96.

Further, in a similar manner as above, the four third inner leads 60c each having a width of 15 μm were arranged at an electrode-to-electrode pitch $p(e)_3$ of 30 μm between the second bump electrodes 68b, and a distance $f_3$ between the third inner lead 60c and the second bump electrode 68b was made to 15 μm. In addition, at least 15 μm or more was secured for a distance between the second bump electrodes 68b between which the third inner leads 60c were not formed.

Further, the third bump electrodes 68c were formed at an alignment pitch of 55 μm to secure at least 15 μm for a distance between the third bump electrodes 68c.

As in Example 1, copper foil having a thickness of 5 μm formed on the film substrate 101 (FIG. 2(a)) was etched, thereby forming inner lead 60 having a width $v_3$ of 15 μm which is of a wiring pattern depending on the arrangement of the bump electrode 68 formed on the semiconductor chip 96, and the second inner leads 60b and the third inner leads 60c were formed at an electrode-to-electrode pitch $p(e)_3$ of 30 μm.

The bump electrode 68 and the inner lead 60 were bonded with each other using the inner lead bonding apparatus (FIG. 3), thereby obtaining the COF shown in FIG. 5(a). In the obtained COF, the third inner leads 60a were formed at a pitch $p(o)_3$ of 220 μm. Consequently, a substantial inner lead pitch became 220 μm/7=31.4 μm, which realized improvement in fine pitch. The bump electrode and the inner lead could be bonded with each other at a bonding accuracy of the conventionally well-known inner lead bonding apparatus. Note that, in the bonding, the second inner leads 60b and the third inner leads 60c formed at the electrode-to-electrode pitch $p(e)_3$ of 30 μm did not peel, deform, or come into contact with one another.

EXAMPLE 4

For the formation of the COF shown in FIG. 8, the outer-side bump electrodes 58a, 88a and the inner-side bump electrodes 58b, 88b were formed on the semiconductor chip 96. A bump electrode having a width $w_2$ of 25 μm was used for the both-ends region outer-side bump electrodes 58a and the both-ends region inner-side bump electrodes 58b. A bump electrode having a width $w_4$ of 20 μm was used for the central region outer-side bump electrodes 88a and the central region inner-side bump electrodes 88b.

The both-ends region outer-side bump electrodes 58a and the both-ends region inner-side bump electrodes 58b were formed at the same alignment pitch and inner lead pitch as those in Example 2.

As to the central region outer-side bump electrodes 88a, the four inner inner leads 80b each having a width of 15 μm were arranged at an electrode-to-electrode pitch of 30 μm between the central region outer-side bump electrodes 88a. To make 15 μm of a distance between the inner inner lead 80b and the central region outer-side bump electrode 88a, the outer-side bump electrodes 88a were formed at a distance of 135 μm on the semiconductor chip 96. Moreover, to make 15 μm of a distance between the inner-side bump electrode 88b, the inner-side bump electrode 88b were formed at an alignment pitch of 30 μm.

Further, the inner lead 50, 80, which is of a wiring pattern depending on the arrangement of the bump electrodes 58, 88 formed on the semiconductor chip 96, was formed with a width of 15 μm.

The bump electrode 58, 88 and the inner lead 50, 80 were bonded with each other using the inner lead bonding apparatus (FIG. 3), thereby obtaining the COF shown in FIG. 8. In the obtained COF, as described in Example 2, the both-ends region outer inner leads 50a were formed at a pitch $p(o)_2$ of 130 μm. Consequently, a substantial inner lead pitch in the both-ends region became 130 μm/4=32.5 μm.

Furthermore, the central region outer inner leads 80a were formed at a pitch $p(o)_4$ of 155 μm. Consequently, a substantial inner lead pitch in the central region became 155 μm/5=31 μm. The inner inner leads 50b were formed at a bonding pitch $p(i)_4$ of 30 μm.

As a result of this, a substantial inner lead pitch in the all region including the both-ends region and the central region became 31.8 μm, which realized improvement in fine pitch. The bump electrode and the inner lead could be bonded with each other at a bonding accuracy of the conventionally well-known inner lead bonding apparatus. Note that, in the bonding, the second inner leads 50b, 80b formed at the electrode-to-electrode pitch of 30 μm did not peel, deform, or come into contact with one another.

Note that, with the use of copper foil having a thickness of 5 μm, the inner leads can be formed at a pitch of 20 μm, so that a substantial inner lead pitch in the both-ends region becomes 105 m/4=26.25 μm. Moreover, a substantial inner lead pitch in the central region becomes 115 μm/5=23 μm. As a result of this, a substantial inner lead pitch in the all region including the both-ends region and the central region becomes 24.3 μm, which realized further improvement in fine pitch.

Specific embodiments and examples implemented in the description of the embodiments only show technical features of the present invention and are not intended to limit the scope of the invention. Variations can be effected within the spirit of the present invention and the scope of the following claims.

What is claimed is:

1. A semiconductor device including a semiconductor chip, comprising:

edge-side bump electrodes each placed on the semiconductor chip at a position which is a relatively small distance apart from an edge of the semiconductor chip; and inside bump electrodes each placed on the semiconductor chip at a position which is a relatively large distance apart from the edge of the semiconductor chip, the edge-side bump electrodes and the inside bump electrodes being bonded with lead wires provided on a film substrate, wherein:

between the edge-side bump electrodes adjacent to each other provided are at least two lead wires for inside bump electrode use which are bonded with the inside bump electrodes, and at least one of the lead wires for inside bump electrode use is bent in accordance with a bonding position with the inside bump electrode.

2. The semiconductor device according to claim 1, wherein:

the lead wires for inside bump electrode use are provided so as to be at a smaller pitch between the edge-side bump electrodes than at the bonding positions with the inside bump electrodes.

3. The semiconductor device according to claim 2, wherein:

the lead wire for inside bump electrode use is bent between a position where the edge-side bump electrode is placed and a position where the inside bump electrode is placed.

4. The semiconductor device according to claim 1, wherein:

the lead wire for inside bump electrode use between the edge-side bump electrodes has a width of not less than 1 μm nor more than 15 μm.

5. The semiconductor device according to claim 1, wherein:

a distance between the edge-side bump electrodes is not less than 50 μm nor more than 150 μm.

6. The semiconductor device according to claim 1, wherein:

when bonded with the inside bump electrode, the lead wire for inside bump electrode use is not less than 100 μm nor more than 500 μm in length, extending from the edge of the semiconductor chip to an inside end of the inside bump electrode.

7. The semiconductor device according to claim 1, wherein:

the edge-side bump electrode and the inside bump electrode are provided in a periphery along at least one of four edges of the semiconductor chip, and the inside bump electrode is larger in number than the edge-side bump electrode.

8. The semiconductor device according to claim 7, wherein:

the inside bump electrodes placed at both ends among the inside bump electrodes are placed at positions on the inward side of the edge-side bump electrodes placed at both ends among the edge-side bump electrodes in a direction parallel to the edge of the semiconductor chip.

9. The semiconductor device according to claim 1, wherein:

at least some of the inside bump electrodes are placed in a direction different from a direction in which the edge-side bump electrode is placed.

10. The semiconductor device according to claim 9, wherein:

among the inside bump electrodes, the inside bump electrodes having a direction different from a direction in which the edge-side bump electrode is placed are placed at positions which are a relatively larger distance apart from the edge of the semiconductor chip than other inside bump electrodes.

11. The semiconductor device according to claim 9, wherein:

at least some of the inside bump electrodes are connected to at least one of a semiconductor element and a chip interconnection on the semiconductor chip.

12. The semiconductor device according to claim 1, wherein:

the number of the lead wires for inside bump electrode use which are provided between the edge-side bump electrodes placed at least at both ends and their adjacent positions among the edge-side bump electrodes may be less than the number of the lead wires for inside bump electrode use which are provided between the edge-side bump electrodes placed at positions other than the both ends.

13. The semiconductor device according to claim 12, wherein:

respective widths of the edge-side bump electrodes and the inside bump electrodes placed at least at both ends among the edge-side bump electrodes and the inside bump electrodes may be larger than respective widths of the edge-side bump electrodes and the inside bump electrodes placed at positions other than the both ends.

14. The semiconductor device according to claim 1, wherein:

the inside bump electrode further includes first inside bump electrodes each placed at a position which is a relatively small distance apart from the edge of the semiconductor chip and second inside bump electrodes each placed at a position which is a relatively large distance apart from the edge of the semiconductor chip, and lead wires for inside bump electrode use which are bonded with the second inside bump electrodes are provided between at least some of the first inside bump electrodes which are adjacent to each other.

15. The semiconductor device according to claim 14, wherein:

an electrode-to-electrode region where the lead wire for inside bump electrode use is provided and an electrode-to-electrode region where the lead wire for inside bump electrode use is not provided are alternately provided between the first inside bump electrodes adjacent to each other.

\* \* \* \* \*